(12) United States Patent
Sautto et al.

(10) Patent No.: US 12,388,374 B2
(45) Date of Patent: Aug. 12, 2025

(54) REAL-TIME MISFIRE DETECTION

(71) Applicant: Renesas Electronics America Inc., Milpitas, CA (US)

(72) Inventors: Marco Sautto, Zurich (CH); John Padraig Hennessy, Zurich (CH)

(73) Assignee: Renesas Electronics America Inc., Milpitas, CA (US)

( * ) Notice: Subject to any disclaimer, the term of this patent is extended or adjusted under 35 U.S.C. 154(b) by 394 days.

(21) Appl. No.: 17/899,128

(22) Filed: Aug. 30, 2022

(65) Prior Publication Data

US 2024/0072682 A1 Feb. 29, 2024

(51) Int. Cl.
*H02M 1/32* (2007.01)
*H02M 7/219* (2006.01)
*G01R 19/00* (2006.01)
*H02J 50/10* (2016.01)
*H02J 50/80* (2016.01)

(52) U.S. Cl.
CPC ............. *H02M 7/219* (2013.01); *H02M 1/32* (2013.01); *G01R 19/0038* (2013.01); *H02J 50/10* (2016.02); *H02J 50/80* (2016.02)

(58) Field of Classification Search
CPC .......... H02M 1/12; H02M 1/32; H02M 1/322; H02M 3/3155; H02M 3/158; H02M 3/33507; H02M 3/33546; H02M 7/1557; H02M 7/1626; H02M 1/4208; H02M 7/53871; H02M 7/12; H02M 7/219; H02M 7/151; H02M 1/4233; H02M 5/4585; H02M 7/217; H02M 1/08; H02M 7/1552; H02M 7/1623; H02M 1/4225; H02M 3/33592; H02M 3/073; H02M 3/10; H02M 3/135; H02M 3/137; H02M 7/10; H02M 7/00; H02M 7/06; H02M 7/064; H02M 7/068; H02M 3/156; H02M 7/5387; H02M 1/083; H02M 1/14; H02M 1/4216; G05F 1/30; G05F 1/33; G05F 1/32; G05F 1/34; G05F 1/38; G05F 1/52; H02J 7/12
See application file for complete search history.

(56) References Cited

U.S. PATENT DOCUMENTS

| | | | |
|---|---|---|---|
| 9,112,422 B1 * | 8/2015 | Vinciarelli | H02M 1/38 |
| 11,043,847 B2 * | 6/2021 | Cheng | H04B 5/79 |
| 2002/0113494 A1 * | 8/2002 | Winick | H02J 1/108 |
| | | | 307/85 |
| 2023/0044377 A1 * | 2/2023 | Liu | H02J 50/23 |

\* cited by examiner

*Primary Examiner* — Jeffrey A Gblende
(74) *Attorney, Agent, or Firm* — SCULLY, SCOTT, MURPHY & PRESSER, P.C.

(57) ABSTRACT

Systems and methods for wireless power transfer systems are described. A controller can be coupled to a power rectifier configured to rectify alternating current power into direct current power. The power rectifier can include a first high side transistor, a second high side transistor, a first low side transistor, and a second low side transistor. The controller can be configured to operate the power rectifier in full bridge rectifier mode. The controller can be further configured to detect a misfire event between the wireless power receiver and a wireless power transmitter. The controller can be further configured to, in response to detection of the misfire event, switch an operation mode of the power rectifier from the full bridge rectifier mode to a diode mode.

19 Claims, 6 Drawing Sheets

REAL-TIME MISFIRE DETECTION

BACKGROUND

The present disclosure relates in general to apparatuses and methods for operating wireless power receivers under different modes to address misfire events in wireless power transfer applications.

Wireless power systems can include a transmitter having a transmission coil and a receiver having a receiver coil. In an aspect, the transmitter may be connected to a structure including a wireless charging region. In response to a device including the receiver being placed on the charging region, or in proximity to the charging region, the transmission coil and the receiver coil can be inductively coupled with one another to form a transformer that can facilitate inductive transfer of alternating current (AC) power. The transfer of AC power, from the transmitter to the receiver, can facilitate charging of a battery of the device including the receiver.

SUMMARY

In one embodiment, a semiconductor device for wireless power receiver is generally described. The semiconductor device can include a power rectifier and a controller. The power rectifier can be configured to rectify alternating current (AC) power into direct current (DC) power. The power rectifier can include a first high side transistor, a second high side transistor, a first low side transistor, and a second low side transistor. The controller can be configured to operate the power rectifier in full bridge rectifier mode. The controller can be further configured to detect a misfire event between the wireless power receiver and a wireless power transmitter. The controller can be further configured to, in response to the detection of the misfire event, switch an operation mode of the power rectifier from the full bridge rectifier mode to a diode mode.

In one embodiment, an apparatus for operating a wireless power receiver is generally described. The apparatus can include a plurality of comparators and a controller. The plurality of comparators can be configured to measure voltage levels across a first high side transistor, a second high side transistor, a first low side transistor, and a second low side transistor of a power rectifier. The plurality of comparators can be further configured to output a plurality of signals. The controller can be configured to operate the power rectifier in full bridge rectifier mode. The controller can be further configured to, based on the plurality of signals outputted by the plurality of comparators, detect a misfire event between the wireless power receiver and a wireless power transmitter. The controller can be further configured to, in response to the detection of the misfire event, switch an operation mode of the power rectifier from the full bridge rectifier mode to a diode mode.

In one embodiment, a method for operating a wireless power receiver is generally described. The method can include operating, by a controller, a power rectifier of a wireless power receiver in full bridge rectifier mode. The method can further include receiving, by the controller, a plurality of signals from a plurality of comparators. The plurality of signals can be based on measurements of voltage levels across a first high side transistor, a second high side transistor, a first low side transistor, and a second low side transistor of a power rectifier. The method can further include, based on the plurality of signals, detecting, by the controller, a misfire event between the wireless power receiver and a wireless power transmitter. The method can further include, in response to the detection of the misfire event, switching, by the controller, an operation mode of the power rectifier from the full bridge rectifier mode to a diode mode.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
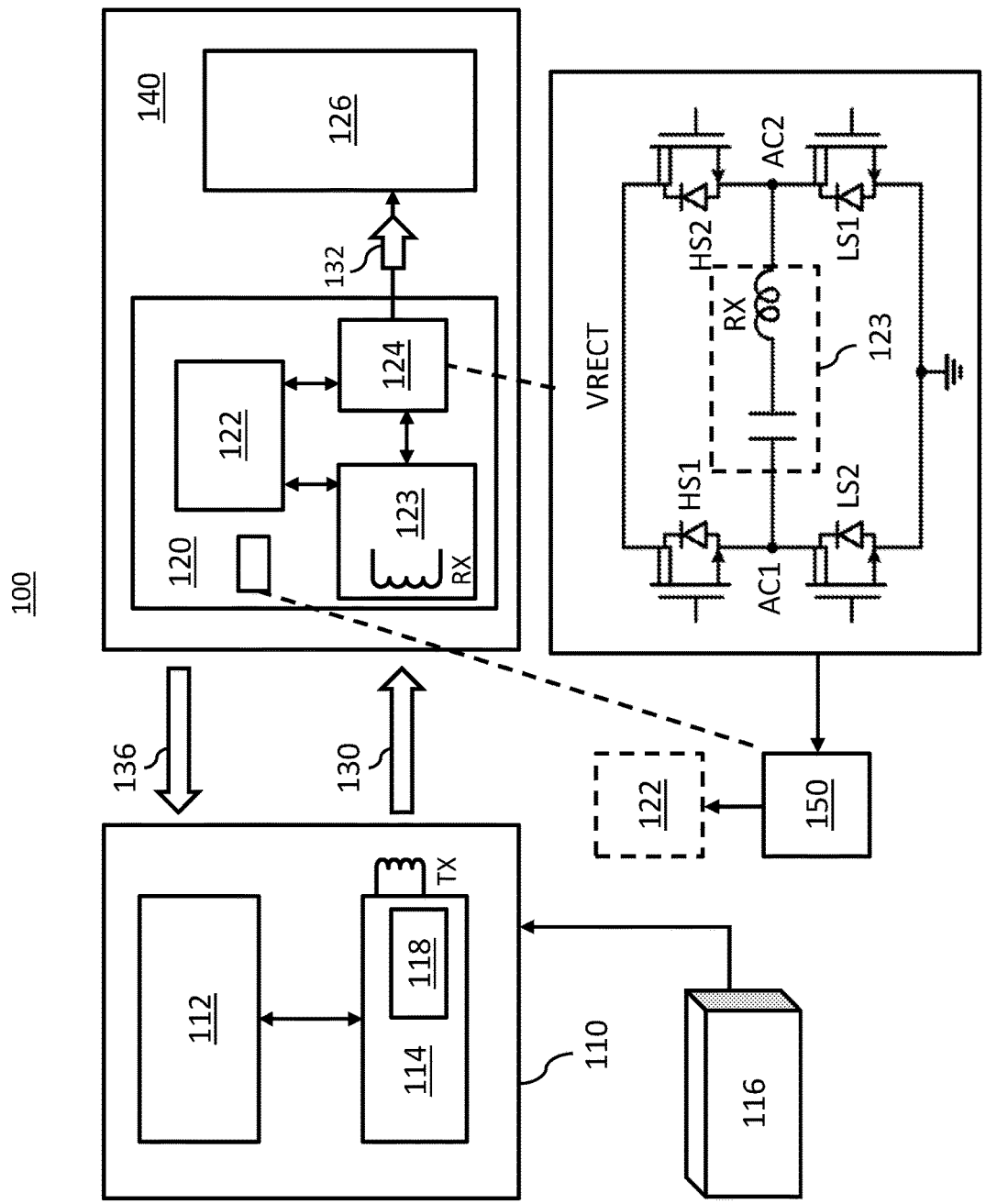
FIG. 1 is a diagram showing an example system that can implement real-time misfire detection in one embodiment.

FIG. 1 is a diagram showing an example system that can implement real-time misfire detection in one embodiment. System 100 can include power devices, such as a transmitter 110 and a receiver 120, that are configured to wirelessly transfer power and data therebetween via inductive coupling. While described herein as transmitter 110 and receiver 120, each of transmitter 110 and receiver 120 may be configured to both transmit and receive power or data therebetween via inductive coupling. Transmitter 110 can be referred to as a wireless power transmitter and receiver 120 can be referred to as a wireless power receiver.

Transmitter 110 is configured to receive power from one or more power supplies and to transmit AC power 130 to receiver 120 wirelessly. For example, transmitter 110 may be configured for connection to a power supply 116 such as, e.g., an adapter or a DC power supply. Transmitter 110 can be a semiconductor device including a controller 112 and a power driver 114.

Controller 112 can be configured to control and operate power driver 114. Controller 112 can include, for example, a processor, central processing unit (CPU), field-programmable gate array (FPGA) or any other circuitry that is configured to control and operate power driver 114. While described as a CPU in illustrative embodiments, controller 112 is not limited to a CPU in these embodiments and may comprise any other circuitry that is configured to control and operate power driver 114. In an example embodiment, controller 112 can be configured to control power driver 114 to drive a coil TX of the power driver 114 to produce a magnetic field. Power driver 114 can be configured to drive coil TX at a range of frequencies and configurations defined by wireless power standards, such as, e.g., the Wireless Power Consortium (Qi) standard, the Power Matters Alliance (PMA) standard, the Alliance for Wireless Power (A for WP, or Rezence) standard or any other wireless power standards.

Receiver 120 can be configured to receive AC power 130 transmitted from transmitter 110 and to supply the power to one or more loads 126 or other components of a destination device 140. Load 126 may comprise, for example, a battery charger that is configured to charge a battery of the destination device 140, a DC-DC converter that is configured to supply power to a processor, a display, or other electronic components of the destination device 140, or any other load of the destination device 140. Destination device 140 may comprise, for example, a computing device, mobile device, mobile telephone, smart device, tablet, wearable device or any other electronic device that is configured to receive power wirelessly. In an illustrative embodiment, destination device 140 can include receiver 120. In other embodiments, receiver 120 may be separate from destination device 140 and connected to destination device 140 via a wire or other component that is configured to provide power to destination device 140.

Receiver 120 can be a semiconductor device including a controller 122, a resonant circuit 123, and a power rectifier 124. Controller 122 can be an integrated circuit including, for example, a digital controller such as a microcontroller, a processor, CPU, FPGA or any other circuitry that may be configured to control and operate power rectifier 124. Resonant circuit 123 can include a coil RX and one or more capacitors, inductors, resistors, that can form circuitry for outputting communication packets 136 and conveying AC power 130, received from transmitter 110, to power rectifier 124. Power rectifier 124 can include rectifier circuits such as half-bridge rectifiers, full bridge rectifiers, or other types of rectifier circuits that can be configured to rectify power received via resonant coil RX of resonant circuit 123 into a power type as needed for load 126. Power rectifier 124 is configured to rectify AC power 130 into DC power 132 which may then be supplied to load 126. Controller 122 can be configured to execute application specific programs and/or firmware to control and operate various components, such as resonant circuit 123 and power rectifier 124, of receiver 120.

As an example, when receiver 120 is placed in proximity to transmitter 110, the magnetic field produced by coil TX of power driver 114 induces a current in coil RX of resonant circuit 123. The induced current causes AC power 130 to be inductively transmitted from power driver 114 to power rectifier 124, via resonant circuit 123. Power rectifier 124 receives AC power 130 and converts AC power 130 into DC power 132. DC power 132 is then provided by power rectifier 124 to load 126.

Transmitter 110 and receiver 120 are also configured to exchange information or data, e.g., messages, via the inductive coupling of power driver 114 and resonant circuit 123. For example, before transmitter 110 begins transferring power to receiver 120, a power contract may be agreed upon and created between receiver 120 and transmitter 110. For example, receiver 120 may send communication packets 136 or other data to transmitter 110 that indicate power transfer information such as, e.g., an amount of power to be transferred to receiver 120, commands to increase, decrease, or maintain a power level of AC power 130, commands to stop a power transfer, or other power transfer information. In another example, in response to receiver 120 being brought in proximity to transmitter 110, e.g., close enough such that a transformer may be formed by coil TX and coil RX to allow power transfer, receiver 120 may be configured to initiate communication by sending a signal to transmitter 110 that requests a power transfer. In such a case, transmitter 110 may respond to the request by receiver 120 by establishing the power contract or beginning power transfer to receiver 120, e.g., if the power contract is already in place. Transmitter 110 and receiver 120 may transmit and receive communication packets 136, data or other information via the inductive coupling of coil TX and coil RX. In some embodiments, communication between transmitter 110 and receiver 120 can occur before power transfer stage using various protocols such as near field communication (NFC), Bluetooth, etc.

Details of power rectifier 124 is shown in FIG. 1. In an example, in response to receiving AC power 130, power rectifier 124 can rectify AC power 130 into DC voltage in order to supply DC power 132 to load 126. AC power 130 can be received through the AC1 and AC2 nodes of power rectifier 124. Four transistors HS1, HS2, LS1, LS2, which can be metal-oxide-semiconductor field-effect transistors (MOSFETs), can form power rectifier 124 that enable supplying the rectifier voltage (VRECT) to rectify the AC power 130. Controller 122 can alternately switch the pair of transistors HS1, LS1 and the pair of transistors HS2, LS2 to operate power rectifier 124 in an active mode (e.g., full bridge rectifier mode). Under the active mode, when transistors HS1, LS1 are switched on, transistors HS2, LS2 are switched off, and vice versa. Further, under the active mode, current can flow from ground to VRECT in order to supply VRECT. Controller 122 can also control power rectifier 124 to operate under a passive mode. The passive mode of power rectifier 124 can be a diode mode, where transistors HS1, HS2, LS1, LS2 are switched off and the intrinsic diodes of transistors HS1, HS2, LS1, LS2 can allow current to flow from ground to VRECT through intrinsic diodes of transistors HS1, HS2, LS1, LS2.

An active mode of power rectifier 124 can start at an initial state where all transistors HS1, HS2, LS1, LS2 are switched off. From the initial state, controller 122 can switch on a pair of transistors, such as transistors HS1, LS1, to form a current path from ground to VRECT via transistors HS1, LS1 (herein "HS1-LS1 path"). When transistors HS1, LS1 are switched on, transistors HS2, LS2 are switched off. To switch from the HS1-LS1 path to another current path from ground to VRECT via transistors HS2, LS2 (herein "HS2-LS2 path"), controller 122 can wait for a minimum-ON time ("MIN-ON time) before performing the switch. The MIN-ON time can be a minimum required time for a pair of transistors to stay switched on under active mode. In response to expiration of the MIN-ON time, controller 122 can switch off transistors HS1, LS1 to switch off all transistors HS1, HS2, LS1, LS2, then subsequently switch on the pair of transistors HS2, LS2 to form the HS2-LS2 path.

To have a proper rectification, power rectifier 124 has to be precisely synchronized with transmitter 110. Under particular conditions, the synchronization can be lost and this causes an overshoot in the coil current that is discharging VRECT—which can be referred to as a misfire event. A misfire event can include one or more cycles where current goes from VRECT to ground, instead of from ground to VRECT. When current goes from VRECT to ground, VRECT is being discharged. Misfire events can occur in response to heavy external perturbances, such as heavy load step changes or coupling factor changes (e.g. when destination device 140 is physically moved). Such external perturbance can cause an incorrect pair of high side and low side transistors to be switched on (e.g., HS2, LS2 can be incorrectly switched on during a cycle where HS1, LS1 is supposed to be switched on).

In an aspect, misfire events can be self-sustaining for a variable number of cycles, and current can increase during these cycles, causing increased current to go in an undesirable direction (e.g., from VRECT to ground). For example, a misfire event can include more than one misfire cycle where current flows from VRECT to ground. In one embodiment, controller 122 can be configured to detect a first misfire cycle (e.g., an initial misfire cycle) of a misfire event (e.g., synchronization lost) when power rectifier 124 is operating under active mode. In response to the detection of the first misfire cycle, controller 122 can switch power rectifier 124 into passive or diode mode operation to restore synchronization of power rectifier with transmitter 110. Further, controller 122 can be configured to monitor outputs from a circuit 150 that can be integrated between power rectifier 124 and controller 122. Circuit 150 can include a plurality of comparators configured to detect current and/or voltage events at power rectifier 124. For example, circuit 150 can detect voltages across transistors LS1, LS2 and, in response to specific values of the detected current and/or voltages, output signals that can be read by controller 122. Controller 122 can read the signals outputted by circuit 150 to detect misfire events and/or to determine whether to switch power rectifier 124 to diode mode.

Figure 2:
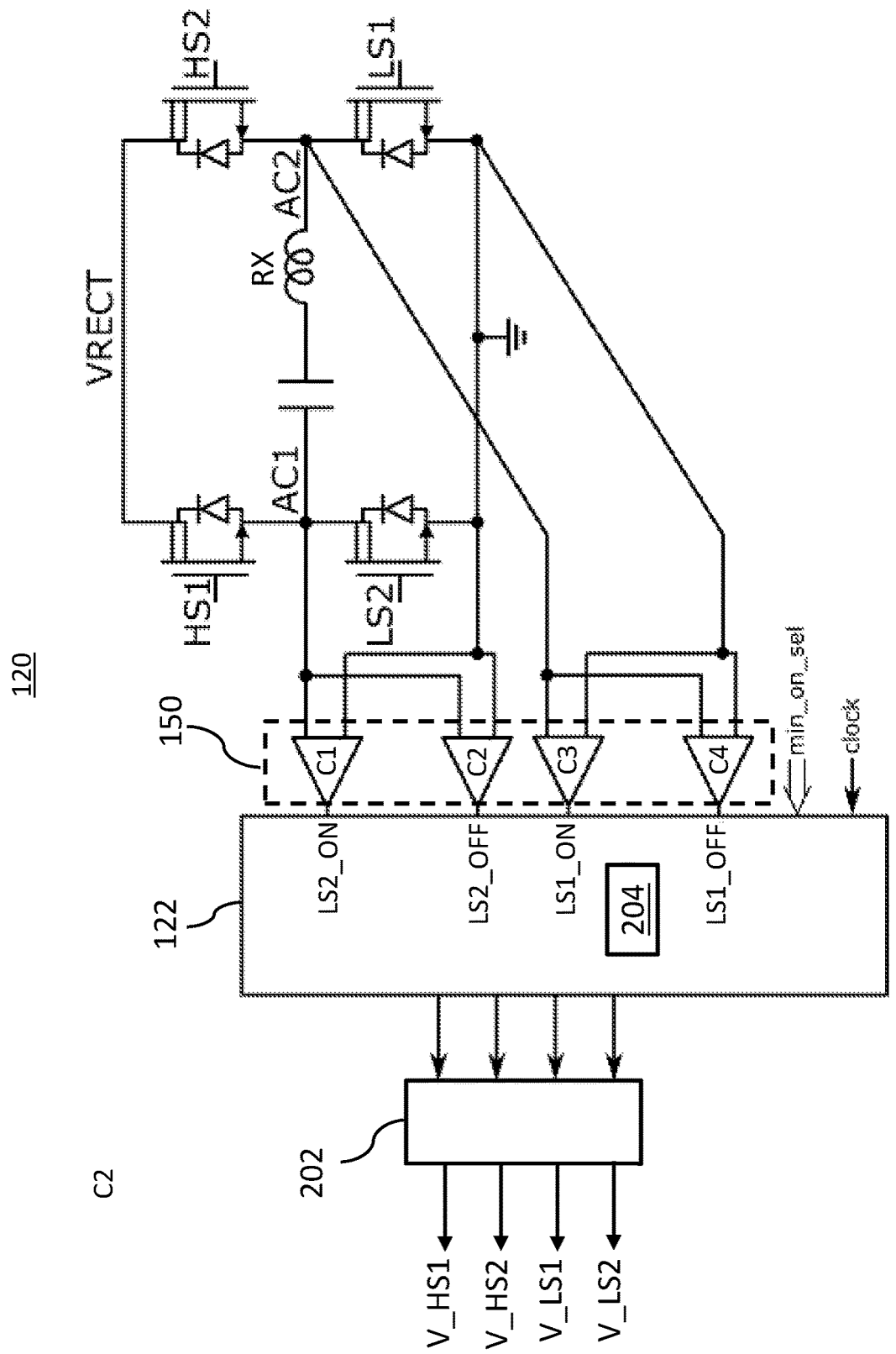
FIG. 2 is a diagram showing a circuit that can implement real-time misfire detection in one embodiment.

FIG. 2 is a diagram showing a circuit that can implement real-time misfire detection in one embodiment. In an example shown in FIG. 2, circuit 150 can include a plurality of comparators C1, C2, C3, C4. In one embodiment, comparators C1, C2, C3, C4 in circuit 150 can be Schmitt triggers. In one embodiment, controller 122 can detect misfire events based on signals LS1_ON, LS2_ON, LS1_OFF, LS2_OFF.

Comparator C1 can receive a voltage level measured across transistor LS2 as inputs, and output a signal LS2_ON. In one embodiment, signal LS2_ON can have a voltage level representing a binary value (e.g., logic HIGH or LOW, or binary one or zero). Controller 122 can read the voltage level of signal LS2_ON. The voltage level of signal LS2_ON can indicate a current flow direction, such as from VRECT to ground or from ground to VRECT, of current flowing through transistor LS2.

Comparator C3 can receive a voltage level measured across transistor LS1 as inputs, and output a signal LS1_ON. In one embodiment, signal LS1_ON can have a voltage level representing a binary value (e.g., logic HIGH or LOW, or binary one or zero). Controller 122 can read the voltage level of signal LS1_ON. The voltage level of signal LS1_ON can indicate a current flow direction, such as from VRECT to ground or from ground to VRECT, of current flowing through transistor LS1.

Figure 3:
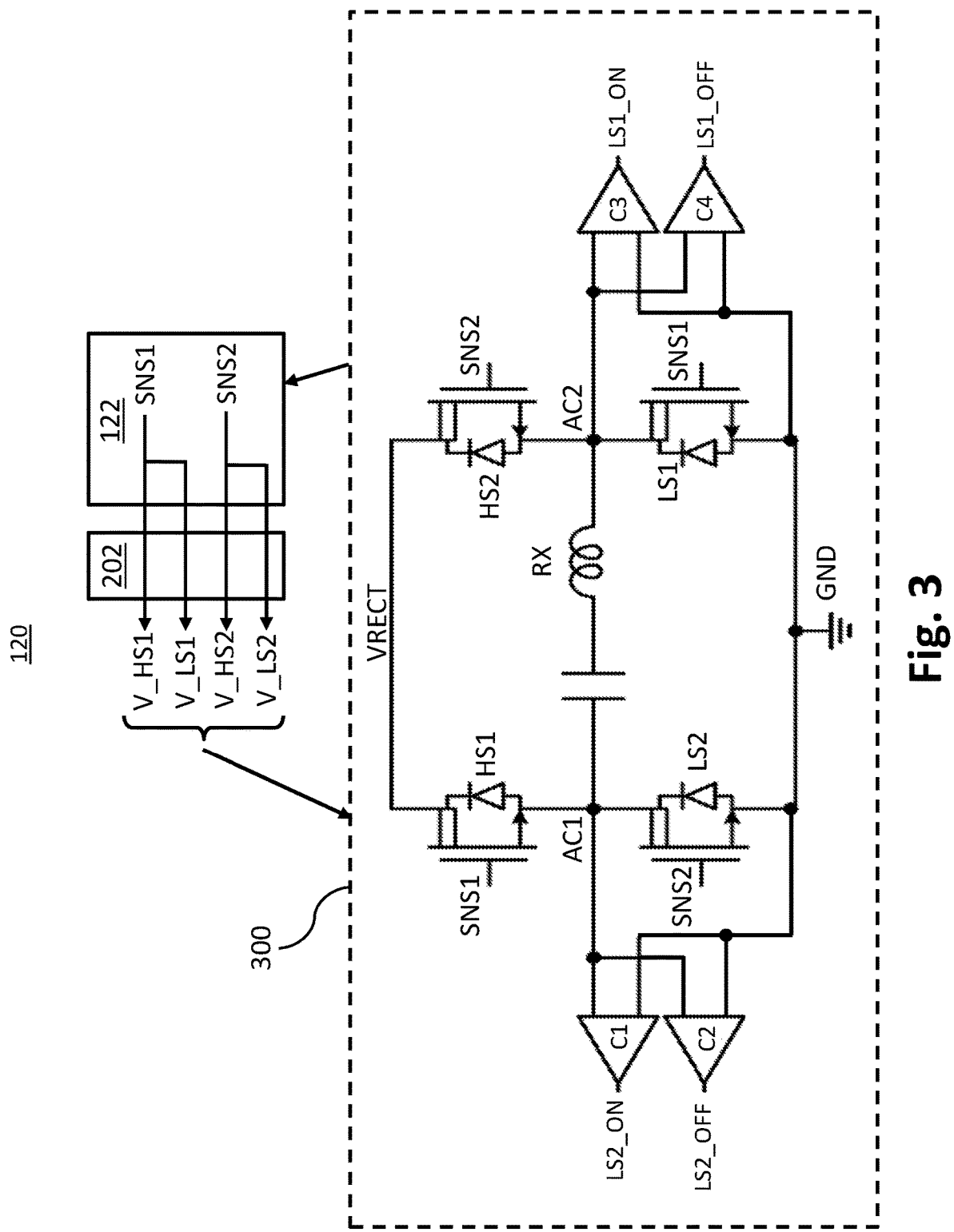
FIG. 3 is a diagram showing a circuit that can implement real-time misfire detection in one embodiment.

FIG. 3 is a diagram showing a circuit that can implement real-time misfire detection in one embodiment. A circuit 300 shown in FIG. 3 can include power rectifier 124 and comparators C1, C2, C3, C4. Under active or full bridge rectifier mode, controller 122 can alternately switch the pair of transistors HS1, LS1 and the pair of transistors HS2, LS2. For instance, transistors HS1, LS1 can be switched on while transistors HS2, LS2 are switched off, and transistors HS1, LS1 can be switched off while transistors HS2, LS2 are switched on. In response to transistors HS1, LS1 being switched on, the HS1-LS1 path can be formed from ground to VRECT and current can flow from AC2 to AC1. In response to transistors HS2, LS2 being switched on, the HS2-LS2 path can be formed from ground to VRECT and current can flow from AC1 to AC2.

Controller 122 can be configured to generate a drive signal SNS1 that can be used for switching on transistors HS1, LS1. Further, controller 122 can be configured to generate a drive signal SNS2 that can be used for switching on transistors HS2, LS2. Drive signals SNS1 and SNS2 can be nonoverlapping signals (e.g., will not have the same values or voltage levels). In one embodiment, under the active mode, controller 122 can output drive signal SNS1, as V_HS1 and V_LS1, to drive transistors HS1, LS1, via gate driver 202, using SNS1. Controller 122 can output drive signal SNS2, as V_HS2 and V_LS2, to drive transistors HS2, LS2, via gate driver 202, using SNS2.

Under passive or diode mode, controller 122 can switch off transistors HS1, HS2, LS1, LS2. In response to transistors HS1, HS2, LS1, LS2 being switched off, current can flow from ground to VRECT through intrinsic diodes of transistors HS1, HS2, LS1, LS2, hence always charging VRECT. Under the diode mode, drive signal SNS1, SNS2 will not be outputted such that the gates of transistors HS1, HS2, LS1, LS2 will not be driven and transistors HS1, HS2, LS1, LS2 can be switched off.

Figure 4:
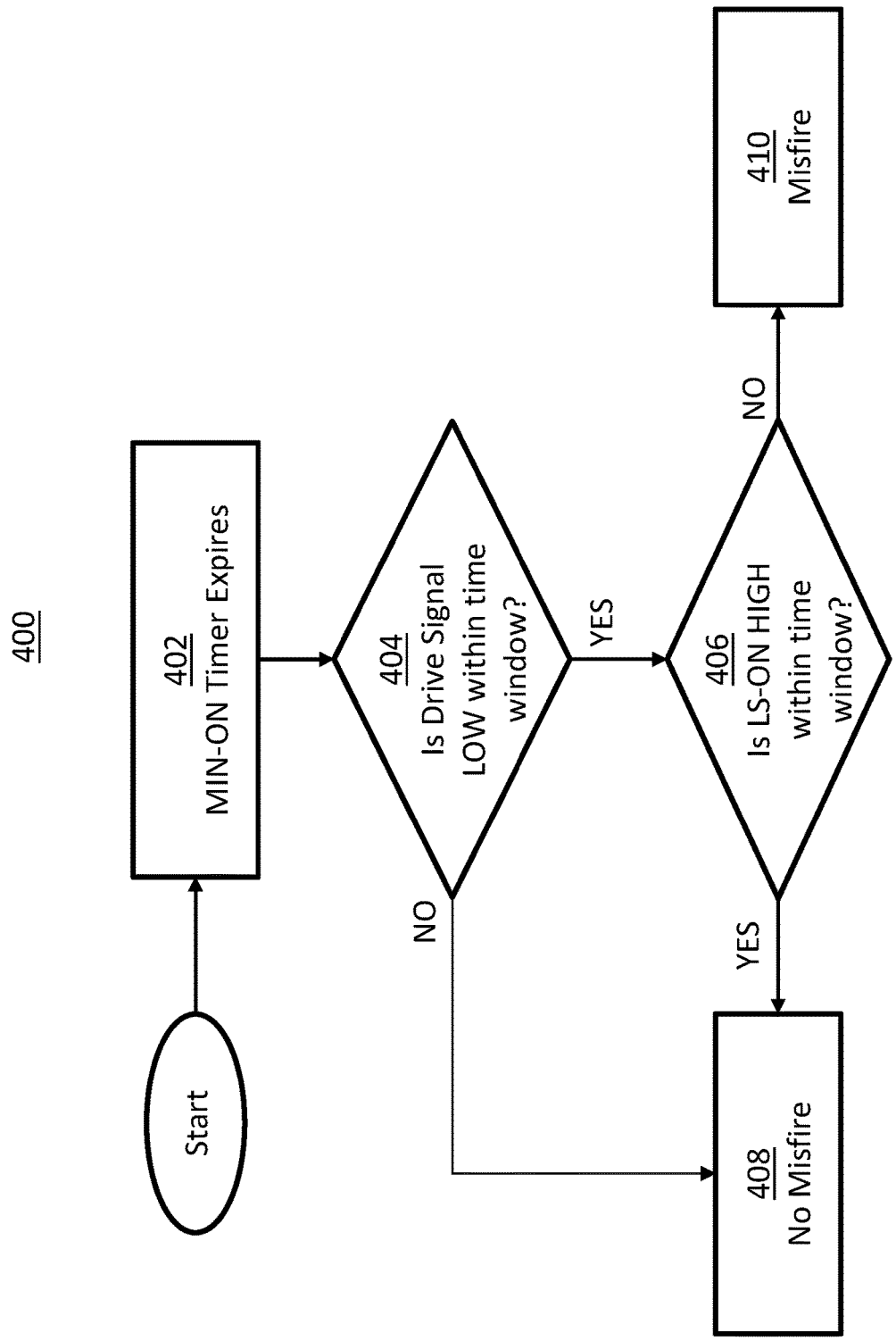
FIG. 4 is a flow diagram illustrating a process of implementing real-time misfire detection in one embodiment.

FIG. 4 is a flow diagram illustrating a process of implementing real-time misfire detection in one embodiment. The process 400 may include one or more operations, actions, or functions as illustrated by one or more of blocks 402, 404, 406, 408 and/or 410. Although illustrated as discrete blocks, various blocks can be divided into additional blocks, combined into fewer blocks, eliminated, or performed in parallel, and/or performed in different order, depending on the desired implementation. Descriptions corresponding to FIG. 4 can reference components of FIG. 1-3.

Process 400 can be performed by a wireless power receiver, such as receiver 120 of FIG. 1, during a full bridge rectifier mode of a power rectifier (e.g., power rectifier 124 in FIG. 1). Process 400 can be performed for identifying a potential misfire event, and determining whether the identified potential misfire event is real (e.g., has occurred) or not (e.g., has not occurred). Process 400 can be performed for an active current path (e.g., current path that is on) for every operation cycle of power rectifier 124. Each operation cycle of power rectifier 124, under the full bridge rectifier mode, can have one active current path while the other current path is off. For example, the HS1-LS1 path can be on while the HS2-LS2 path is off, and vice versa. Process 400 can begin at block 402, where a minimum ON (MIN_ON) time of an active current path (e.g., HS1-LS1 path or HS2-LS2 path) can expire.

In response to the expiration of the MIN-ON time, process 400 can proceed to block 404. At block 404, a controller (e.g., controller 122) of the wireless power receiver can detect or determine whether a drive signal (e.g., SNS1 or SNS2) being used to switch on the active current path is logic HIGH or logic LOW. The detection at block 404 can be performed during a predetermined time window that can begin in response to the expiration of the MIN-ON time at each operating cycle of power rectifier 124. A duration of the time window can be programmable and can be based on a desired implementation of system 100.

Within the time window at block 404, if the drive signal that switches on the active current path is HIGH (404: NO), then process 400 can proceed to block 408, where the controller can determine that there is no occurrence of misfire events. The drive signal that switches on the active current path being HIGH can indicate that the active current path has been switched on during an entirety of the MIN-ON time and synchronization was not lost during the MIN-ON time, hence no misfire events.

Within the time window at block 404, if the drive signal that switches on the active current path is LOW (404: YES), then the controller can determine that there is a potential misfire event. The drive signal that switches on the active current path being LOW can indicate that either 1) the active current path was scheduled to switched off in response to the expiration of the MIN-ON time, or 2) the active current path was switched off during the MIN-ON time. The active current path being switched off during the MIN-ON time can indicate that a misfire event (e.g., synchronization lost) may have occurred before the expiration of MIN-ON. In response to the controller determining that there is a potential misfire event (404:YES), process 400 can proceed to block 406.

At block 406, the controller can receive a voltage level of a signal being outputted by an ON-comparator corresponding to the active current path. The ON-comparator corresponding to the active current path can be the comparator that is monitoring voltage level across a low side transistor of the active current path. For example, comparator C1 can monitor voltage level across transistor LS2 for the HS2-LS2 path and comparator C3 can monitor voltage level across transistor LS1 for the HS1-LS1 path. The controller can use the received voltage level to determine whether the potential misfire event (identified at block 404) is real (e.g., has occurred) or not (e.g., has not occurred).

The voltage level received by the controller can indicate a current flow direction across the low side transistor of the active current path. If current is flowing in the correct direction (e.g., ground to VRECT), then the voltage of an AC node (e.g., AC1 or AC2) corresponding to the active current path can go below ground, and the ON-comparator corresponding to the active current path can be toggled from LOW to HIGH. Hence, if the voltage level of the signal received by the controller at block 406 indicates logic HIGH (406: YES), then the controller can determine that there is no misfire event (e.g., block 408).

If current is flowing in an incorrect direction (e.g., VRECT to ground), then the voltage of an AC node (e.g., AC1 or AC2) corresponding to the active current path can be above ground, and the ON-comparator corresponding to the active current path can remain LOW. Hence, if the voltage level of the signal received by the controller at block 406 indicates logic LOW (406: NO), then the controller can determine that the potential misfire event is real (e.g., block 410).

Figure 5:
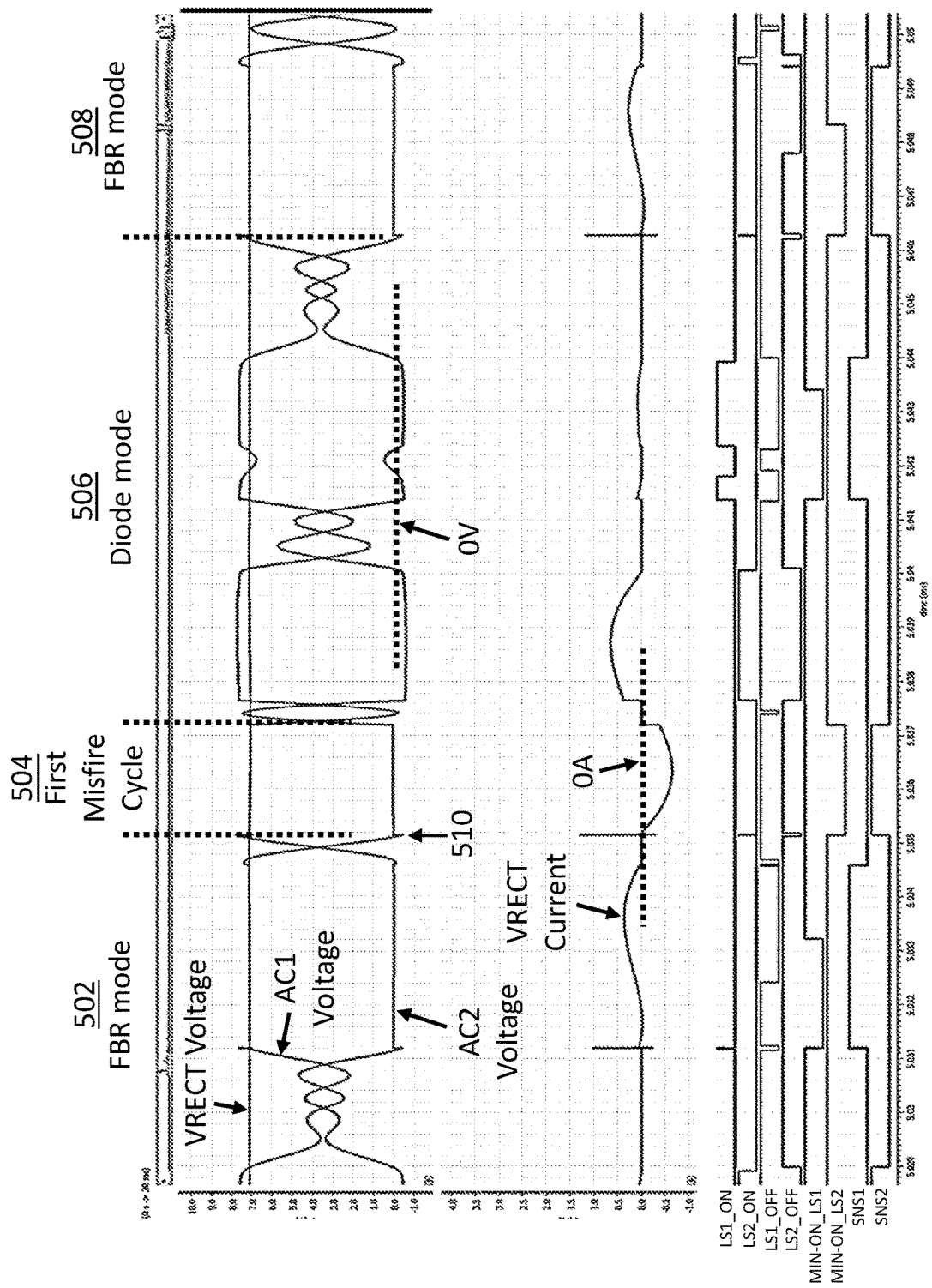
FIG. 5 is a diagram illustrating waveforms of an operation of a wireless power receiver implementing real-time misfire detection in one embodiment.

FIG. 5 is a diagram illustrating waveforms of an operation of a wireless power receiver implementing real-time misfire detection in one embodiment. Descriptions corresponding to FIG. 4 can reference components of FIG. 1-4. In FIG. 5, power rectifier 124 can be operating under full bridge rectifier (FBR) mode during a time period 502. During time period 502, VRECT current can be positive (e.g., greater than zero amperes), indicating that current is flow in the correct direction from ground to VRECT. At a time 510, a voltage at node AC1 can go below zero ground (e.g., below zero volts) and the VRECT current can become negative, indicating that current is flowing in an incorrect direction from VRECT to ground. Controller 122, based on process 400 of FIG. 4, can detect a misfire event at a time period 504. In one embodiment, time period 504 can be one operation cycle of power rectifier 124, and controller 122 can detect the first misfire cycle of the misfire event. The detection of the first misfire cycle can be performed during a time window, which can be a predetermined amount of time, that begins in response to the expiration of the MIN-ON time.

In response to detecting this first misfire cycle, controller 122 can switch power rectifier 124 to operate in diode mode for one or more cycles. In the example shown in FIG. 5, power rectifier 124 can operate under diode mode during time period 506, where time period 506 can include two operation cycles. To operate power rectifier 124 in diode mode, controller 122 can switch off transistors HS1, HS2, LS1, LS2 during time period 506. The number of operation cycles to operate power rectifier 124 can be programmable, and can be dependent on various factors, such as a desired implementation of system 100, a status of various operating parameters of receiver 120, predetermined parameters such as MIN-ON time, and/or other types of factors relating to operations of receiver 120. In one embodiment, controller 122 can operate power rectifier 124 until synchronization is restored (e.g., by monitoring for a desired VRECT current for a predetermined amount of time or cycles). In response to expiration of time period 506, synchronization is restored (e.g., current is consistently above zero) and controller 122 can switch power rectifier 124 to operate under FBR mode in time period 508.

The apparatuses and methods described herein can configure a wireless power receiver to address misfire events by restoring synchronization in response to detection of a first misfire cycle, instead of allow the misfire event to prolong for more than one cycle. The detection of the first misfire cycle, and inserting one or more cycles of diode mode, can restore the synchronization before current in the receiver coil raising to an undesirable level. Therefore, the reduced duration of misfire events can prevent current spike and overshoot into the receiver coil, and can reduce a risk of damaging the receiver coil. Further, the apparatuses and methods described herein may not require addition of relatively bulky analog hardware.

Figure 6:
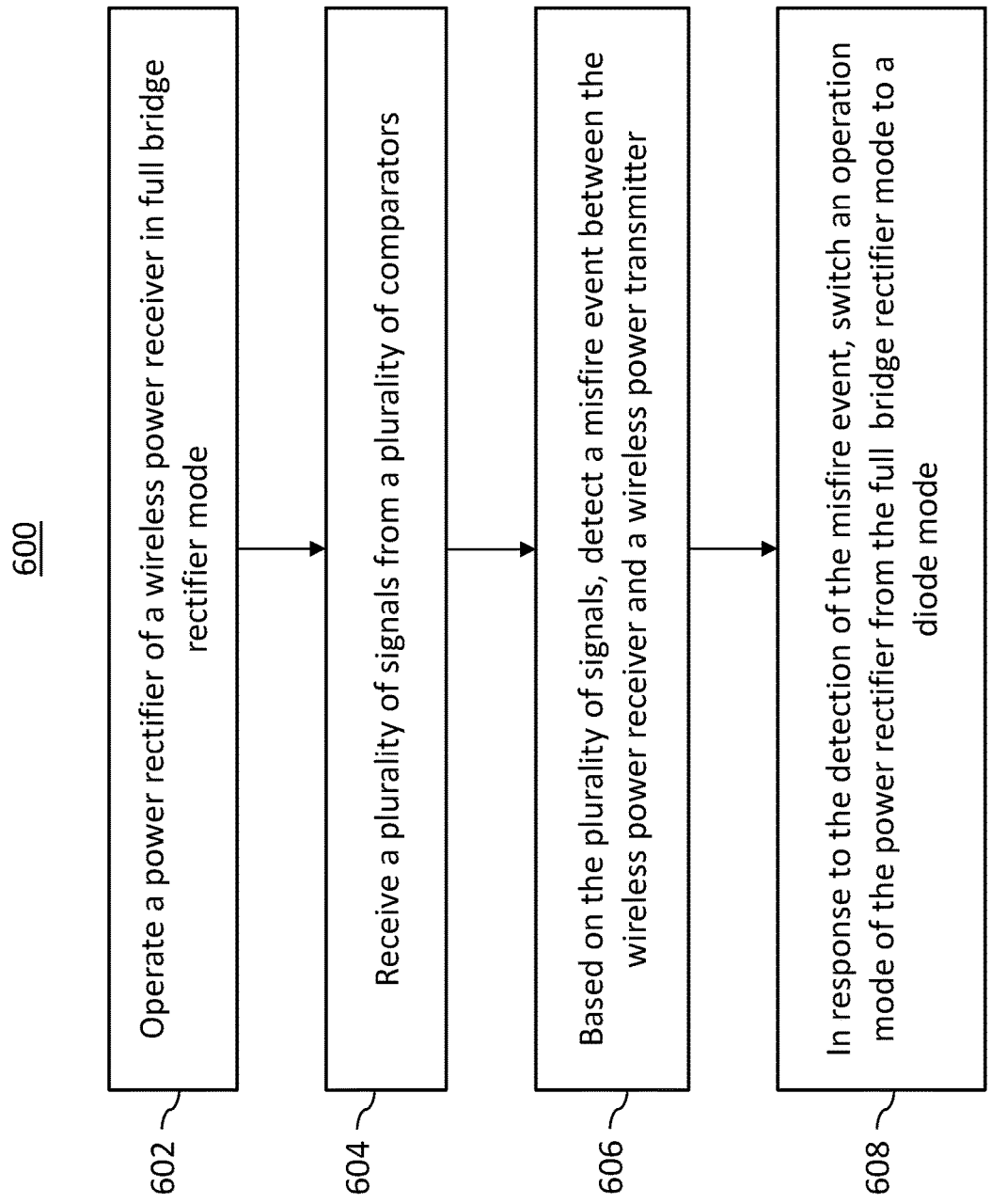
FIG. 6 is a flow diagram illustrating another process of implementing real-time misfire detection in one embodiment.

FIG. 6 is a flow diagram illustrating another process of implementing real-time misfire detection in one embodiment. The process 600 may include one or more operations, actions, or functions as illustrated by one or more of blocks 602, 604, 606, and/or 608. Although illustrated as discrete blocks, various blocks can be divided into additional blocks, combined into fewer blocks, eliminated, or performed in parallel, and/or performed in different order, depending on the desired implementation. Descriptions of process 600 can refer to components of FIGS. 1-4.

Process 600 can be performed by a controller (e.g., controller 122 described herein) of a wireless power receiver (e.g., receiver 120 described herein). Process 600 can begin at block 602. At block 602, a controller can operate a power rectifier of a wireless power receiver in full bridge rectifier mode. Process 600 can proceed from block 602 to block 604. At block 604, the controller can receive a plurality of signals from a plurality of comparators. The plurality of signals can be based on measurements of voltage levels across a first high side transistor, a second high side transistor, a first low side transistor, and a second low side transistor of a power rectifier.

Process 600 can proceed from block 604 to block 606, At block 606, the controller can, based on the plurality of signals, detect a misfire event between the wireless power receiver and a wireless power transmitter. In one embodiment, the controller can detect the misfire event by detecting an initial misfire cycle of the misfire event.

In one embodiment, under the full bridge rectifier mode of the power rectifier, the controller can, in response to an expiration of a minimum ON time, detect whether a drive signal being used for switching on a current path is HIGH or LOW. In response to the drive signal being HIGH, the controller can determine that the misfire event has not occurred. In response to the drive signal being LOW, the controller can identify a potential misfire event. In one embodiment, the controller can detect whether the drive signal is HIGH or LOW during a predetermined time window that begins in response to the expiration of the minimum ON time.

In one embodiment, in response to identifying the potential misfire event, the controller can determine whether a voltage level measured across a low side transistor of the current path indicates HIGH or LOW. In response to the voltage level indicating HIGH, the controller can determine that the potential misfire event has not occurred. In response to the voltage level indicating LOW, the controller can determine that the potential misfire has occurred.

Process 600 can proceed from block 606 to block 608, At block 608, the controller can, in response to the detection of the misfire event, switch an operation mode of the power rectifier from the full bridge rectifier mode to a diode mode. In one embodiment, the controller can switch the operation mode of the power rectifier from the full bridge rectifier mode to the diode mode by switching off the first high side transistor, the second high side transistor, the first low side transistor, and the second low side transistor.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A semiconductor device for a wireless power receiver, the semiconductor device comprising:
    a power rectifier configured to rectify alternating current (AC) power into direct current (DC) power, the power rectifier including a first high side transistor, a second high side transistor, a first low side transistor, and a second low side transistor;
    a controller; and
    a plurality of comparators configured to:
        measure voltage levels across the first high side transistor, the second high side transistor, the first low side transistor, and the second low side transistor; and
        output a plurality of signals indicating the measured voltage levels to the controller,
    wherein the controller configured to:
        operate the power rectifier in full bridge rectifier mode;
        detect a misfire event between the wireless power receiver and a wireless power transmitter based on the plurality of signals; and
        in response to detection of the misfire event, switch an operation mode of the power rectifier from the full bridge rectifier mode to a diode mode.

2. The semiconductor device of claim 1, wherein the controller is configured to switch off the first high side transistor, the second high side transistor, the first low side transistor, and the second low side transistor to operate the power rectifier under the diode mode.

3. The semiconductor device of claim 1, wherein the controller is configured to detect an initial misfire cycle of the misfire event.

4. The semiconductor device of claim 1, wherein under the full bridge rectifier mode of the power rectifier, the controller is configured to:
    in response to an expiration of a minimum ON time, determine whether a drive signal being used for switching on a current path is HIGH or LOW;
    in response to determination of the drive signal being HIGH, determine that the misfire event has not occurred; and
    in response to determination of the drive signal being LOW, identify a potential misfire event.

5. The semiconductor device of claim 4, wherein in response to identification of the potential misfire event, the controller is configured to:
    determine whether a voltage level measured across a low side transistor of the current path indicates HIGH or LOW;
    in response to determination of the voltage level indicating HIGH, determine that the potential misfire event has not occurred; and
    in response to determination of the voltage level indicating LOW, determine that the potential misfire event has occurred.

6. The semiconductor device of claim 4, wherein detection of whether the drive signal is HIGH or LOW is performed in a predetermined time window that begins in response to the expiration of the minimum ON time.

7. The semiconductor device of claim 1, wherein the controller is configured operate the power rectifier in the diode mode for one or more cycles.

8. An apparatus comprising:
a plurality of comparators configured to:
measure voltage levels across a first high side transistor, a second high side transistor, a first low side transistor, and a second low side transistor of a power rectifier; and
output a plurality of signals indicating the measured voltage levels; and
a controller configured to:
operate the power rectifier in full bridge rectifier mode;
based on the plurality of signals outputted by the plurality of comparators, detect a misfire event between the power rectifier and a wireless power transmitter; and
in response to the detection of the misfire event, switch an operation mode of the power rectifier from the full bridge rectifier mode to a diode mode.

9. The apparatus of claim 8, wherein the controller is configured to switch off the first high side transistor, the second high side transistor, the first low side transistor, and the second low side transistor to operate the power rectifier under the diode mode.

10. The apparatus of claim 8, wherein the controller is configured to detect an initial misfire cycle of the misfire event.

11. The apparatus of claim 8, wherein under the full bridge rectifier mode of the power rectifier, the controller is configured to:
in response to an expiration of a minimum ON time, determine whether a drive signal being used for switching on a current path is HIGH or LOW;
in response to determination of the drive signal being HIGH, determine that the misfire event has not occurred; and
in response to determination of the drive signal being LOW, identify a potential misfire event.

12. The apparatus of claim 11, wherein in response to identification of the potential misfire event, the controller is configured to:
determine whether a voltage level measured across a low side transistor of the current path indicates HIGH or LOW, wherein the voltage level is represented by a signal among the plurality of signals;
in response to determination of the voltage level indicating HIGH, determine that the potential misfire event has not occurred; and
in response to determination of the voltage level indicating LOW, determine that the potential misfire event has occurred.

13. The apparatus of claim 12, wherein the detection of whether the drive signal is HIGH or LOW is performed in a predetermined time window that begins in response to the expiration of the minimum ON time.

14. A method for operating a wireless power receiver, the method comprising:
operating, by a controller, a power rectifier of a wireless power receiver in full bridge rectifier mode;
receiving, by the controller, a plurality of signals from a plurality of comparators, wherein the plurality of signals is based on measurements of voltage levels across a first high side transistor, a second high side transistor, a first low side transistor, and a second low side transistor of a power rectifier;
based on the plurality of signals, detecting, by the controller, a misfire event between the wireless power receiver and a wireless power transmitter; and
in response to the detection of the misfire event, switching, by the controller, an operation mode of the power rectifier from the full bridge rectifier mode to a diode mode.

15. The method of claim 14, wherein switching the operation mode of the power rectifier from the full bridge rectifier mode to the diode mode comprises switching off the first high side transistor, the second high side transistor, the first low side transistor, and the second low side transistor.

16. The method of claim 14, wherein detecting the misfire event comprises detecting, by the controller, an initial misfire cycle of the misfire event.

17. The method of claim 14, wherein under the full bridge rectifier mode of the power rectifier, the method further comprising:
in response to an expiration of a minimum ON time, determining, by the controller, whether a drive signal being used for switching on a current path is HIGH or LOW;
in response to determining the drive signal being HIGH, determining, by the controller, that the misfire event has not occurred; and
in response to determining the drive signal being LOW, identifying, by the controller, a potential misfire event.

18. The method of claim 17, wherein in response to identifying the potential misfire event, the method further comprising:
determining, by the controller, whether a voltage level measured across a low side transistor of the current path indicates HIGH or LOW;
in response to determining the voltage level indicating HIGH, determining, by the controller, that the potential misfire event has not occurred; and
in response to determining the voltage level indicating LOW, determining, by the controller, that the potential misfire event has occurred.

19. The method of claim 17, wherein detecting whether the drive signal is HIGH or LOW is performed in a predetermined time window that begins in response to the expiration of the minimum ON time.

* * * * *